United States Patent [19]

Rein

[11] Patent Number: 4,695,940
[45] Date of Patent: Sep. 22, 1987

[54] DYNAMIC FREQUENCY DIVIDER WITH A MIXER STAGE AND AN AMPLIFIER

[75] Inventor: Hans-Martin Rein, Witten, Fed. Rep. of Germany

[73] Assignee: Telefunken electronic GmbH, Heilbronn, Fed. Rep. of Germany

[21] Appl. No.: 835,988

[22] Filed: Mar. 4, 1986

[30] Foreign Application Priority Data

Mar. 15, 1985 [DE] Fed. Rep. of Germany ....... 3509327

[51] Int. Cl.⁴ ............................................. H02M 5/00
[52] U.S. Cl. .................................... 363/157; 455/216; 455/326; 328/25
[58] Field of Search ....................... 363/157, 164, 165; 328/15, 25; 455/112, 216, 323, 326; 330/259–260, 262, 270–271, 291, 293; 307/271

[56] References Cited

U.S. PATENT DOCUMENTS

| | | | |
|---|---|---|---|
| 3,305,730 | 2/1967 | Parzen | 363/157 X |
| 4,058,771 | 11/1977 | Ohsawa et al. | 328/15 X |
| 4,216,431 | 8/1980 | Shibata et al. | 455/326 X |
| 4,242,601 | 12/1980 | Kasperkovitz | 328/25 X |
| 4,268,916 | 5/1981 | Kusakabe | 455/326 X |
| 4,325,144 | 4/1982 | Slusky et al. | 363/157 X |

OTHER PUBLICATIONS

Kasperkovitz, W. D., Frequenzteiler für ultrahohe Frequenzen, "Philips technische Rundschau" 38, No. 2, 1979, pp. 47–62.

Primary Examiner—Peter S. Wong
Attorney, Agent, or Firm—Spencer & Frank

[57] ABSTRACT

A dynamic frequency divider including a mixer stage and a transimpedance amplifier connected to the output of the mixer stage.

7 Claims, 3 Drawing Figures

DYNAMIC FREQUENCY DIVIDER WITH A MIXER STAGE AND AN AMPLIFIER

BACKGROUND OF THE INVENTION

Today, in addition to static dividers, so-called dynamic frequency dividers are used for dividing high frequencies. A dynamic frequency divider is, for example, described in the publication "Philips technische Rundschau" 38, No. 2, 1979, Pages 47–62, in particular, Page 59. This dynamic frequency divider comprises a mixer stage serving to mix signals whose frequencies differ by the factor 2. The output signal of the mixer is amplified by an amplifier which only amplifies the basic frequency of the output signal. This is achieved with an amplifier with low-pass effect or with an amplifier followed by a low-pass filter. The amplified signal with the basic frequency is fed back to the mixer stage, thus creating a closed circuit.

SUMMARY OF THE INVENTION

The object of the invention is to provide a monolithically integratable dynamic frequency divider in accordance with the above-described basic concept, which is so designed that the maximum operating frequency (fmax) is as high as possible and the permissible frequency range is as broad as possible (fmax/fmin large), and that, furthermore, stable operation is possible in the entire frequency range (fmin $\leq$ f $\leq$ fmax). These requirements may be particularly well met if the frequency response of the loop gain of the entire frequency divider (mixer +amplifier) corresponds substantially to that of an ideal amplifier followed by an ideal low-pass with a high limit frequency.

In a dynamic frequency divider with a mixer stage and an amplifier, according to the invention, the amplifier is a transimpedance amplifier or behaves as such.

A transimpedance amplifier is known to have a small output impedance and a small input impedance up to high frequencies at a high band width of the transfer function defined by the quotient of output voltage and input current.

The small values of the input and output impedance ensure a high maximum operating frequency on account of the rapid recharge of parasitic capacitances. An increase in the amplification at high frequencies compensates for the amplification drop in the remaining circuit (mixer and others), whereby the maximum operating frequency is further increased. Furthermore together with the stecp amplification drop, a frequency response of the entire circuit which closely approaches that of an ideal low-pass is thereby obtained.

The desired frequency response of the amplifier is optimally obtained by an inductive component of the amplifier output impedance together with a capacitive load component occurring at the output producing a kind of resonance effect. Such a resonance effect may occur to an increased extent if the load impedance or the output impedance of the amplifier exhibits a negative real part at high frequencies.

The inductive component of the output impedance may be obtained in a simple manner by suitable dimensioning (e.g. via the negative feedback resistance) of the transimpedance stage and/or by emitter followers connected in series. The latter may, under certain circumstances, also ensure a negative real part at high frequencies. The impedance of the mixer input ensures the desired capacitive component of the load. If the mixer is preceded by emitter followers, the desired capacitive component of the load is thereby amplified and simultaneously a negative real part is obtained in a desired manner at high frequencies. The emitter followers connected between the output of the transimpedance stage and the input of the mixer stage for improving the frequency response also serve to decouple amplifier output and mixer input and thus further increase the maximum operating frequency. Furthermore, they are necessary for the level shift in monolithically integrated circuits (direct-current coupling). The use of a differential amplifier is also expedient on account of the direct-current coupling present in monolithically integrated circuits and on account of the higher attainable band width.

BRIEF DESCRIPTION OF THE DRAWINGS

The invention will now be described in greater detail, by way of examples, with reference to the drawings, in which.

DESCRIPTION OF THE PREFERRED EMBODIMENTS

Figure 1:
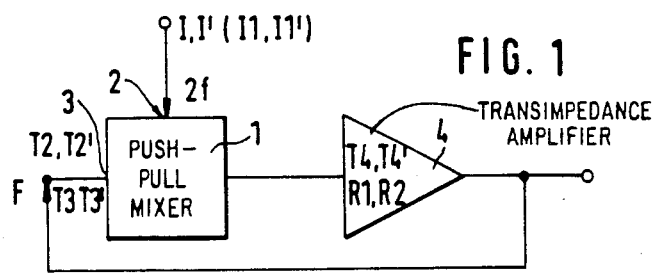
FIG. 1 shows the basic circuit diagram of a dynamic frequency divider.

FIG. 1 shows the basic circuit diagram of a dynamic frequency divider according to the invention. In accordance with FIG. 1, the frequency divider consists of a push-pull mixer 1 with a first input Z and a second input 3 and also of an amplifier 4. The amplifier 4 is a transimpedance amplifier. A transimpedance amplifier is an amplifier wherein the quotient of open circuit voltage of the output and input current is essentially determined by a resistor between input and output of the amplifier, and which, furthermore, exhibits a small input and output impedance. In the case of a simple transistor stage in emitter circuit, this resistor is located between the base and the collector of the amplifier transistor. The output of the transimpedance amplifier 4 is fed back to the second input 3 of the push-pull mixer 1. A closed circuit or a closed loop is created by the feedback.

If a signal with the frequency 2f is applied to the first input 2 of the push-pull mixer 1, and a signal with the frequency f to its second input 3, there occur at the output of the mixer 1 mixed products with the frequencies f (base harmonic) 3f etc. (harmonics). If the output signal of the mixer 1 with the frequencies f, 3f, etc. is amplified by means of the amplifier 4, which has low-pass effect, and if the output signal of the mixer 1 amplifies only the signal part with the frequency f, there remains at the output of the amplifier 4 only a signal with the divided frequency f aimed at, which is fed back to the second input 3 of the mixer 1. The signal with the basic frequency f required for the mixing and the dividing, which must be fed to the mixer 1 in addition to the frequency 2f, need therefore not be generated separately in the dynamic frequency divider of FIG. 1, but is produced in the closed circuit as a mixed product.

Figure 2:
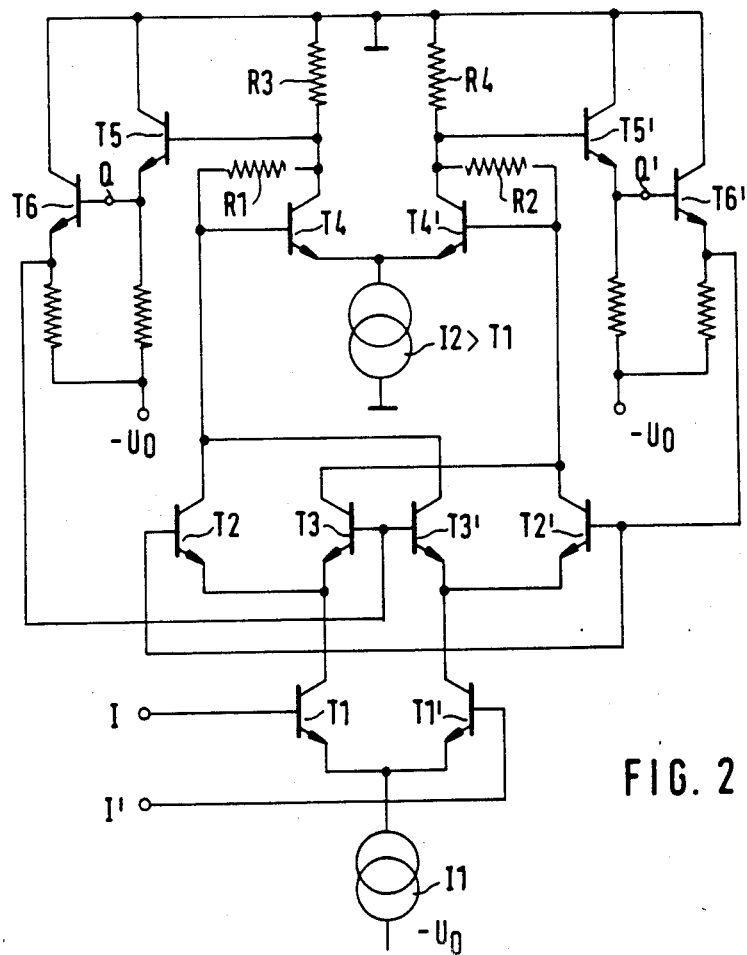
FIG. 2 shows the circuit of FIG. 1 in detail.

FIG. 2 shows the circuit of FIG. 1 in detail. The mixer of the frequency divider is formed by the transistors T1, T1', T2, T2', T3, T3' and the current source I1. The transistors T1 and T1' form a differential amplifier. The transistors T2 and T3, like the transistors T2' and T3', are connected to each other on the emitter side.

The collector of the transistor T1 is connected to the common emitter line of the transistors T2 and T3, and the collector of the transistor T1' to the common emitter line of the transistors T2' and T3'. There is also a connection between the collectors of the transistors T2 and T3', on the one hand, and the collectors of the transistors T2' and T3, on the other hand. The base of the transistor T2 is connected to the base of the transistor T2', and the base of the transistor T3 to the base of the transistor T3'.

In the embodiment shown in FIG. 2, the transimpedance amplifier is a differential amplifier. In accordance with FIG. 2, the amplifier consists of the transistors T4 and T4', the current source I2 and the resistors R1 and R2. As is apparent from FIG. 2, the resistor R1 is connected between the base and the collector of the transistor T4, and the resistor R2 between the base and the collector of the transistor T4'. The resistors R1 and R2 generally have the same values. The collectors of the transistors T4 and T4' are each connected via a resistor (R3, R4) to the reference potential. A current is fed into the transimpedance amplifier by the current source I2 via the common emitter line of the transistors T4 and T4'. This current is larger than the current which the current source I1 feeds into the mixer.

For optimization of the frequency response, decoupling and level shift, two emitter followers each (Darlington stage) are provided, with some of these comprising the transistors T5 and T6 and the others the transistors T5' and T6'. Emitter series resistors which are not identified in FIG. 2 are located in the emitter lines of these transistors.

The input of the mixer is formed by the connection points I and I'. This input is fed a signal with the frequency 2f. The points Q and Q' form an internal output of the frequency divider at which a signal with the frequency f is available.

The frequency divider of FIG. 2 functions as follows. A signal with the frequency 2f to be divided is fed to the input (I, I') of the mixer. The applied current I1 flows through the mixer. By mixing the signal with the frequency 2f with a signal of the frequency f, which is applied to the transistors T2 and T2', on the one hand, and to the transistors T3 and T3', on the other hand, mixed products with the frequencies f (base harmonic), 3f, etc. (harmonics) are produced at the output of the mixer (collector T2, T3' and collector T3, T2', respectively).

If the output signal (mixed products) of the mixer is amplified with an amplifier with low-pass effect, which like the amplifier of FIG. 2 has the characteristic that of the output signal it amplifies only the portion with the frequency f, but suppresses the other portions (3f etc.), only a signal exhibiting the desired frequency f reaches the output of the mixer. This signal is fed back via a feedback circuit consisting of the emitter followers with the transistors T5, T6 and T5', T6' to the transistors T3, T3' and T2, T2' of the mixer. In the oscillation build-up phase of the frequency dividing process, the required frequency f is obtained, for example, from the noise.

The frequency divider of the invention and thus also the frequency divider of FIG. 2 can divide very high frequencies because its amplifier according to the invention is a so-called transimpedance amplifier which consists of the transistors T4 and T4' and wherein one resistor each (R1, R2) is connected between the bases and the collectors of the transistors T4 and T4'. The amplifier operates with the current I2 which must be larger than the mixer current I1.

The embodiment shows with what little component expenditure such a transimpedance amplifier with a decoupling stage may be realized and how simply it can be monolithically integrated. The low power consumption is also worthy of emphasis.

It is essential to the invention that the amplifier of the frequency divider should exhibit through the negative feedback (R1, R2) a small input and output impedance at high band width of the transfer function and that the negative feedback should, furthermore, result in an inductive component of the output impedance. By means of subsequent emitter followers, the inductive component may be amplified and, under certain circumstances, even a negative real part attained. This output impedance ensures in the presence of a load impedance with a capacitive component and, under certain circumstances, a negative real part (realized in the frequency divider according to the invention, for example, by emitter followers or Darlington stages) that the amplifier according to FIG. 3 exhibits an amplification rise at high frequencies with a subsequent steep amplification drop.

Figure 3:
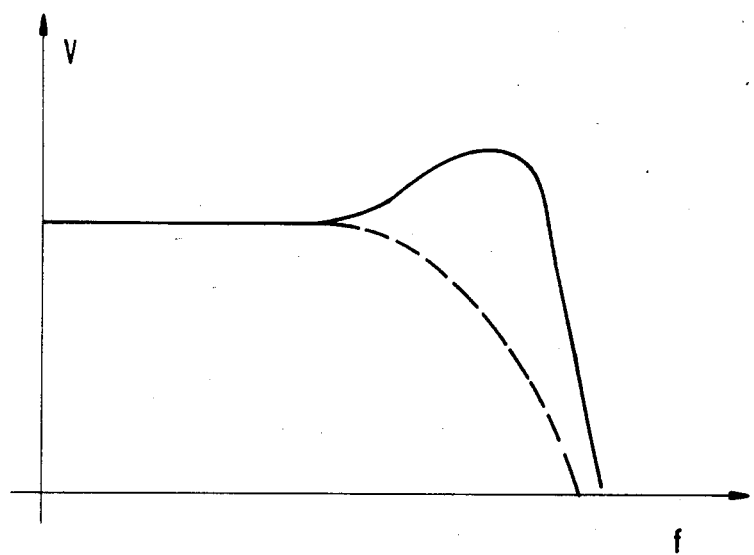
FIG. 3 shows the dependency of the amplification on the frequency in a dynamic frequency divider according to the invention.

Coupled with the amplification rise in the frequency divider according to the invention shown in FIG. 3, is a subsequently steep amplification drop which ensures, as desired, a very good low-pass behavior of the entire frequency divider for filtering out the undesired frequencies (harmonic 3f etc.).

In the frequency divider according to the invention, the desired amplifier characteristics are attained by use of a transimpedance amplifier instead of a normal amplifier. A transimpedance amplifier differs—in its simplest design—from a simple normal amplifier in that in the amplifier transistor (T4, T4'), an ohmic resistor (R1, R2) which causes a negative feedback is connected between the base and the collector. This resistor is dimensioned such that loop gain and band width are sufficiently high and that the amplification curve shown in FIG. 3 exhibits a rise in conjunction with a steep drop at high frequencies.

What is claimed is:

1. A dynamic frequency divider for producing a signal having a frequency f from a signal having a frequency 2f, comprising: a mixer stage having first and second inputs and an output, said first input receiving a signal of frequency 2f; and a transimpedance amplifier having an input connected to the output of said mixer stage and an output connected to the second input of said mixer stage for feeding back to said mixer stage a signal of frequency f.

2. A frequency divider according to claim 1, further including means, comprising one of emitter followers and Darlington stages connected to the output of said amplifier, for frequency response optimization, impedance conversion and level shift of the signal at the output of said amplifier.

3. A frequency divider according to claim 1, wherein said amplifier exhibits a small output impedance and a small input impedance and has a transfer function with a large band width.

4. A frequency divider according to claim 1, wherein said amplifier exhibits a rise in amplification at high frequencies with a subsequent steep drop in amplification.

5. A frequency divider according to claim 1, wherein said amplifier exhibits an output impedance with at least one of an inductive component and a negative real part.

6. A frequency divider according to claim 1, further including a load with at least one of a capacitive component and a negative real part connected at the output of said amplifier.

7. A frequency divider according to claim 1, wherein said amplifier is a differential amplifier.

* * * * *